(12) United States Patent
Leobandung

(10) Patent No.: US 9,917,014 B2
(45) Date of Patent: Mar. 13, 2018

(54) VERTICAL AIR GAP SUBTRACTIVE ETCH BACK END METAL

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/497,728

(22) Filed: Apr. 26, 2017

(65) Prior Publication Data

US 2017/0287784 A1    Oct. 5, 2017

Related U.S. Application Data

(62) Division of application No. 15/086,908, filed on Mar. 31, 2016, now Pat. No. 9,653,347.

(51) Int. Cl.
*H01L 21/8234* (2006.01)
*H01L 21/768* (2006.01)
(Continued)

(52) U.S. Cl.
CPC .. *H01L 21/823475* (2013.01); *H01L 21/0217* (2013.01); *H01L 21/02164* (2013.01); *H01L 21/02181* (2013.01); *H01L 21/76843* (2013.01); *H01L 21/76883* (2013.01); *H01L 21/823418* (2013.01); *H01L 21/823468* (2013.01); *H01L 23/5283* (2013.01); *H01L 23/5329* (2013.01);
(Continued)

(58) Field of Classification Search
CPC ............. H01L 21/823475; H01L 21/823481
See application file for complete search history.

(56) References Cited

U.S. PATENT DOCUMENTS 9,536,980 B1 * 1/2017 Huang .................. H01L 29/78
2014/0065818 A1    3/2014 Lu et al.
(Continued)

OTHER PUBLICATIONS

List of IBM Patents or Patent Applications Treated as Related, dated Apr. 26, 2017, 2 pages.

*Primary Examiner* — Marc Armand
(74) *Attorney, Agent, or Firm* — Scully, Scott, Murphy & Presser, P.C.; Louis J. Percello, Esq.

(57) ABSTRACT

After forming source/drain contact structures within an interlevel dielectric (ILD) layer to contact source/drain regions of a field effect transistor (FET), the ILD layer is recessed to expose upper portions of the source/drain contact structures. A sacrificial layer is then formed on a remaining portion of the ILD layer to laterally surround the upper portions of the source/drain contact structures. An interconnect conductor portion is subsequently formed to contact the source/drain contact structures by subtractive patterning of a metal layer that is formed on the sacrificial layer. Next, the sacrificial layer is removed, leaving a void between the interconnect conductor portion and the remaining portion of the ILD layer. An interconnect liner layer is then formed on a top surface and sidewalls of the interconnect conductor portion and on the remaining portion of the ILD layer. The interconnect liner layer encloses an air gap surrounding the upper portions of the source/drain contact structures.

20 Claims, 14 Drawing Sheets

(51) Int. Cl.
*H01L 21/02* (2006.01)
*H01L 23/528* (2006.01)
*H01L 23/532* (2006.01)
*H01L 27/088* (2006.01)

(52) U.S. Cl.
CPC .. *H01L 23/53223* (2013.01); *H01L 23/53238* (2013.01); *H01L 23/53266* (2013.01); *H01L 27/088* (2013.01)

(56) References Cited

U.S. PATENT DOCUMENTS

2016/0276260 A1    9/2016  Liou et al.
2016/0365315 A1*  12/2016  Liu ..................... H01L 23/5226

* cited by examiner

VERTICAL AIR GAP SUBTRACTIVE ETCH BACK END METAL

BACKGROUND

The present application relates to semiconductor devices and manufacturing processes, and more particularly, to a method of reducing parasitic capacitance of transistors during the formation of interconnect structures using a subtractive etch process.

Integrated circuits (ICs) commonly use metal interconnect structures (or "lines") to connect semiconductor devices such as, for example, transistors, on the ICs. These interconnect structures are typically formed using an additive damascene process in which a dielectric layer is patterned to include openings therein. A conductive metal, for example, copper (Cu) is subsequently deposited within the openings and thereafter any conductive metal that is located outside the openings is removed via a planarization process.

However, the conventional additive damascene process is not always compatible with the trend toward smaller feature sizes in modern complementary metal oxide semiconductor (CMOS) technology. For instance, as the line width scales, the resistivity of the metal is increased due to the small metal grain size. In general, a small grain size leads to greater grain boundaries which causes an increase in resistance in conductive metals. As a result, the IC performance is decreased. Moreover, as the circuit components become smaller, parasitic effect once considered minor become more significant. Therefore, a method that allows forming interconnect structures with reduced resistance and also allows reducing parasite capacitance that exists among various components of transistors remains needed.

SUMMARY

The present application provides a method that allows forming interconnect structures with reduced resistance and also allows reducing parasite capacitance that exists among various components of FETs. After forming source/drain contact structures within an interlevel dielectric (ILD) layer to contact source/drain regions of a field effect transistor (FET), the ILD layer is recessed to expose upper portions of the source/drain contact structures. A sacrificial layer is then formed on a remaining portion of the ILD layer to laterally surround the upper portions of the source/drain contact structures. An interconnect conductor portion is subsequently formed to contact the source/drain contact structures by subtractive patterning of a metal layer that is formed on the sacrificial layer. Next, the sacrificial layer is removed, leaving a void between the interconnect conductor portion and the remaining portion of the ILD layer. An interconnect liner layer is then formed on a top surface and sidewalls of the interconnect conductor portion and on the remaining portion of the ILD layer. The interconnect liner layer encloses an air gap surrounding the upper portions of the source/drain contact structures.

In one aspect of the present application, a semiconductor structure is provided. The semiconductor structure includes source/drain regions present on opposite sides of a gate structure that is located over a channel region of a semiconductor material layer, source/drain contact structures and each of the source/drain contact structures contacts one of the source/drain regions, an interlevel dielectric (ILD) portion located over the semiconductor material layer and laterally surrounding the gate structure and a lower portion of each of the source/drain contact structures, an interconnect conductor portion contacting at least one of the source/drain contact structures, an interconnect liner portion having a first portion present on top surfaces and sidewalls of the interconnect conductor portion and a second portion enclosing an air gap located between the interconnect conductor portion and a top surface of the ILD portion, and a contact level dielectric layer located over the interconnect liner portion and the ILD portion and laterally surrounding the interconnect conductor portion.

In another aspect of the present application, a method of forming a semiconductor structure is provided. The method includes first forming source/drain regions on opposite sides of a gate structure located over a channel region of a semiconductor material layer. Source/drain contact structures are then formed in an interlevel dielectric (ILD) layer overlying the semiconductor material layer. Each of the source/drain contact structures contacts one of the source/drain regions. After recessing the ILD layer to expose an upper portion of each of the source/drain contact structures, a sacrificial layer is formed over a remaining portion of the ILD layer to laterally surround the upper portion of each of the source/drain contact structures. Next, an interconnect conductor portion is formed over the sacrificial layer to contact at least one of the source/drain contact structures. The sacrificial layer is subsequently removed to re-expose the upper portion of each of the source/drain contact structures. Next, an interconnect liner portion is formed. The interconnect liner portion includes a first portion present on top surfaces and sidewalls of the interconnect conductor portion and a second portion enclosing an air gap located between the interconnect conductor portion and the remaining portion of the ILD layer.

DETAILED DESCRIPTION

Figure 1:
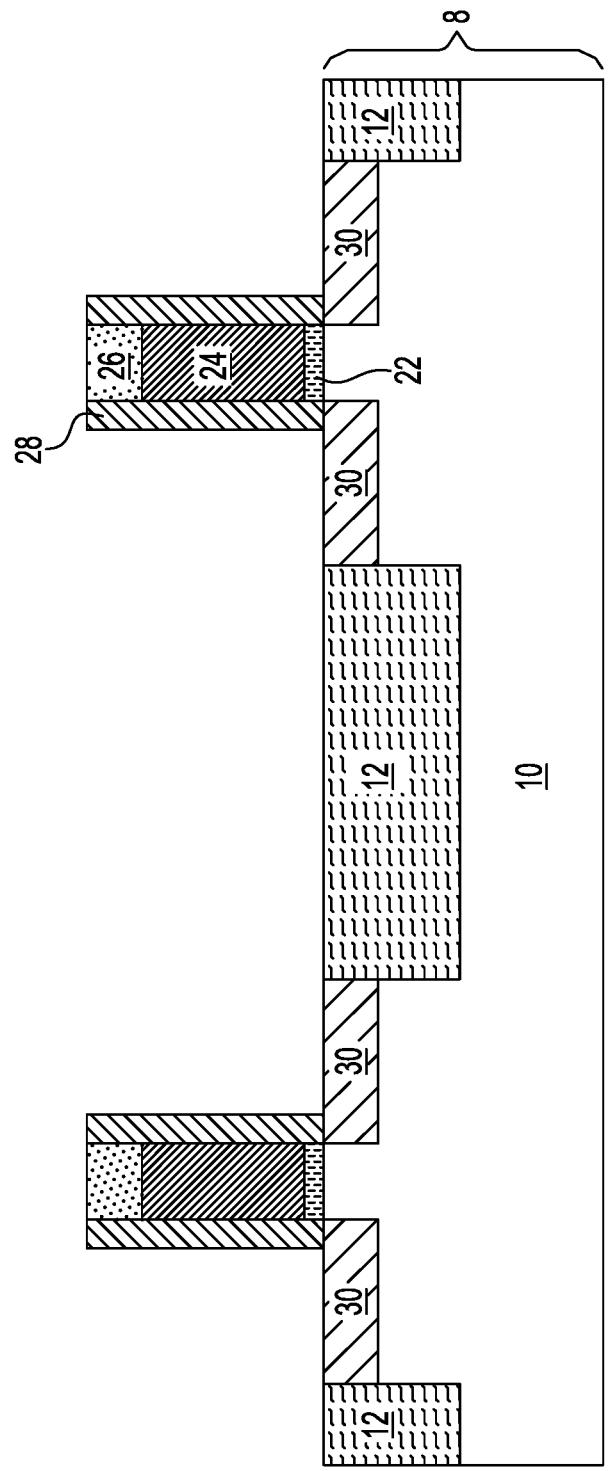
FIG. 1 is a cross-sectional view of an exemplary semiconductor structure including a semiconductor material layer having gate structures and source/drain regions formed thereon according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure according to an embodiment of the present application includes a substrate 8 and various components of FETs that are formed on the substrate 8. The substrate 8 can be a semiconductor-on-insulator (SOI) substrate containing a top semiconductor layer, a buried insulator layer located under the top semiconductor layer, and a bottom semiconductor layer located under the buried insulator layer or a bulk semiconductor substrate including a bulk semiconductor material throughout. The substrate 8 includes a semiconductor material layer 10, which can be a top semiconductor layer of a SOI substrate or an upper portion of a bulk semiconductor substrate. Various doped wells (not shown) having p-type or n-type dopants can be formed in the semiconductor material layer 10. Shallow trench isolation (STI) structures 12 including a dielectric material can be formed in the semiconductor material layer 10 to provide electrical isolation between neighboring semiconductor devices to be formed.

Gate structures are formed on the top surface of the semiconductor material layer 10. Each gate structure includes a gate stack and a gate spacer 28 formed on sidewalls of the gate stack. The gate stack may include, from bottom to top, a gate dielectric 22, a gate electrode 24 and a gate cap 26. The gate stacks can be formed by first providing a material stack (not shown) that includes, from bottom to top, a gate dielectric layer, a gate electrode layer and a gate cap layer over the semiconductor material layer 10.

The gate dielectric layer may include an oxide, nitride or oxynitride. In one example, the gate dielectric layer may include a high-k material having a dielectric constant greater than silicon dioxide. Exemplary high-k dielectrics include, but are not limited to, $HfO_2$, $ZrO_2$, $La2O3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed. The gate dielectric layer can be formed by any deposition technique including, for example, chemical vapor deposition (CVD), plasma enhanced chemical vapor deposition (PECVD), physical vapor deposition (PVD) or atomic layer deposition (ALD). Alternatively, the gate dielectric layer can also be formed by a thermal growth process such as, for example, oxidation, nitridation or oxynitridation to convert surface portions of the semiconductor material layer 10 into a dielectric material. The gate dielectric layer that is formed can have a thickness ranging from 0.5 nm to 10 nm, with a thickness from 0.5 nm to about 3 nm being more typical.

The gate electrode layer may include any conductive material including, for example, doped polysilicon, an elemental metal such as W, Ti, Ta, Al, Ni, Ru, Pd and Pt, an alloy of at least two elemental metals, a metal nitride such as WN and TiN, a metal silicide such as WSi, NiSi, and TiSi or multilayered combinations thereof. The gate electrode layer can be formed utilizing a deposition process including, for example, CVD, PECVD, PVD or ALD. In embodiments in which polysilicon or SiGe are used as the gate electrode material, an in-situ deposition process can be used or alternatively deposition followed by ion implantation can be used. The gate electrode layer that is formed can have a thickness ranging from 50 nm to 200 nm, although lesser or greater thicknesses can also be employed.

The gate cap layer may include a dielectric oxide, nitride or oxynitride. In one embodiment of the present application, the gate cap layer includes silicon nitride. The gate cap layer can be formed by a deposition process including, for example, CVD, PECVD, PVD or ALD. The gate cap layer that is formed can have a thickness ranging from 25 nm to 100 nm, although lesser or greater thicknesses can also be employed.

The material stack is then patterned and etched to form the gate stacks (22, 24, 26). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as a RIE process. Each remaining portion of the gate dielectric layer constitutes the gate dielectric 22. Each remaining portion of the gate electrode layer constitutes the gate electrode 24. Each remaining portion of the gate cap layer constitutes the gate cap 26. The remaining portions of the photoresist layer may be subsequently removed by, for example, ashing.

In one embodiment, the gate stacks (22, 24, 26) can be sacrificial gate stacks that are subsequently removed, and replaced with functional gate stacks each including a functional gate dielectric, a functional gate electrode and a functional gate cap after forming source and drain regions of the semiconductor structure. The term "functional gate stack" as used herein refers to a permanent gate stack used to control output current (i.e., flow of carriers in the channel) of a semiconductor device through electrical fields.

Each gate spacer 28 may include a dielectric material such as, for example, an oxide, a nitride, an oxynitride, or any combination thereof. In one embodiment, each gate spacer 28 is composed of silicon nitride. The gate spacers 28 can be formed by first providing a conformal gate spacer material layer (not shown) on exposed surfaces of the gate stacks (22, 24, 26) and the semiconductor material layer and then etching the gate spacer material layer to remove horizontal portions of the gate spacer material layer. The gate spacer material layer can be provided by a deposition process including, for example, CVD, PECVD or ALD. The etching of the gate spacer material layer may be performed by a dry etch process such as, for example, RIE. The remaining portions of the gate spacer material layer constitute the gate spacer(s) 28. The width of each gate spacer 28, as measured at the base of the gate spacer 28 can be from 5 nm to 100 nm, although lesser and greater widths can also be employed.

A source region and a drain region (collectively referred to as source/drain regions 30) are formed on opposite sides of each sacrificial gate structure 20. In one embodiment and as shown in FIG. 1, the source/drain regions 30 are planar source/drain region formed in the semiconductor material layer 10. The source/drain regions 30 can be formed using, for example, an ion implantation process, during which dopants of the opposite conductivity type than the conductivity type of the semiconductor material layer 10 are implanted into portions of the semiconductor material layer 10 on opposite sides of the gate structures 20 using the gate structures 20 as an implantation mask. For n-type FETs, the source/drain regions 30 can be made by implanting an n-type dopant, while for p-type FETs, the source/drain regions 30 can be made by implanting a p-type dopant. Exemplary n-type dopants include, but are not limited to, P, As or Sb. Exemplary p-type dopants include, but are not limited to, B, Al, Ga or In. Each of the remaining portions of the semiconductor material layer 10 that is located beneath a corresponding gate stack (22, 24, 26) constitutes a channel region of a FET. An activation anneal can be subsequently performed to activate the implanted dopants in the source/drain regions 30.

In another embodiment, the source/drain regions 30 further include raised source/drain regions (not shown) formed on the planar source/drain regions 30. Raised source/drain region may be formed by selective epitaxy. During the selective epitaxy process, the deposited semiconductor material grows only on exposed semiconductor regions, i.e., portions of semiconductor material layer 10 on opposite sides of the gate structures (22, 24, 26, 28) and does not grow on dielectric surfaces, such as surfaces of the gate caps 26, the gate spacers 28 and the STI regions 12.

The semiconductor material (i.e., silicon-containing semiconductor material and germanium-containing semiconductor material) of the raised source/drain regions can be deposited as an intrinsic semiconductor material, or can be deposited with in-situ doping. If the semiconductor material is deposited as an intrinsic semiconductor material, the raised source/drain regions can be subsequently doped (ex-situ) utilizing ion implantation, gas phase doping or dopant out diffusion from a sacrificial dopant source material.

Figure 2:
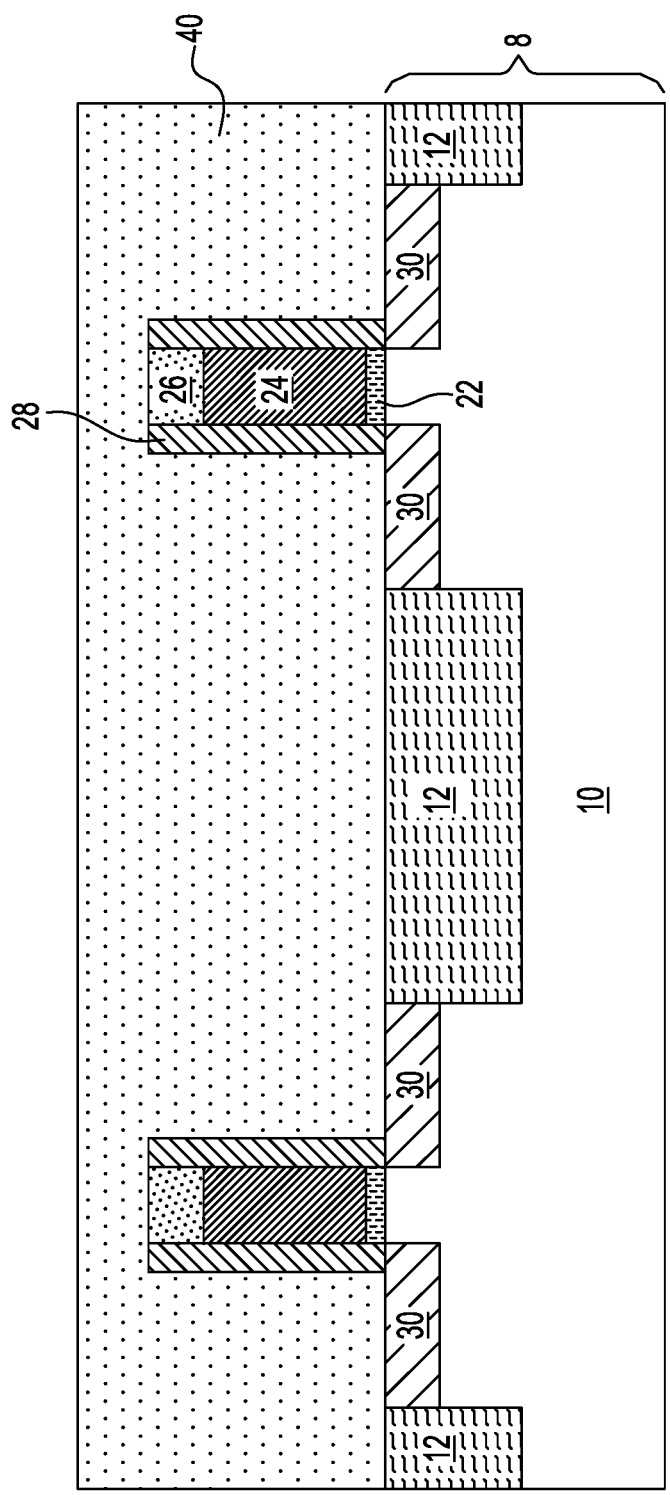
FIG. 2 is a cross-sectional view of the exemplary semiconductor structure of FIG. 1 after forming an interlevel dielectric (ILD) layer over the source/drain regions and the gate structures.

Referring to FIG. 2, an interlevel dielectric (ILD) layer 40 is formed over the source/drain regions 30, the STI regions 12 and the gate structures (22, 24, 26, 28). In some embodiments of the present application, the ILD layer 40 is composed of a dielectric material that can be easily planarized. For example, the ILD layer 40 can include undoped silicon oxide, doped silicon oxide, silicon nitride, porous or non-porous organosilicate glass, porous or non-porous nitrogen-doped organosilicate glass, or a combination thereof. The ILD layer 40 can be deposited using a conventional deposition process, such as, for example, CVD, PECVD or spin-on coating. If the ILD layer 40 is not self-planarizing, following the deposition of the ILD layer 40, the ILD layer 40 can be subsequently planarized, for example, by chemical mechanical planarization (CMP). The planarized top surface of the ILD layer 40 is located above the topmost surfaces of the gate stacks (22, 24, 26) (i.e., the top surfaces of the gate caps 26).

Figure 3:
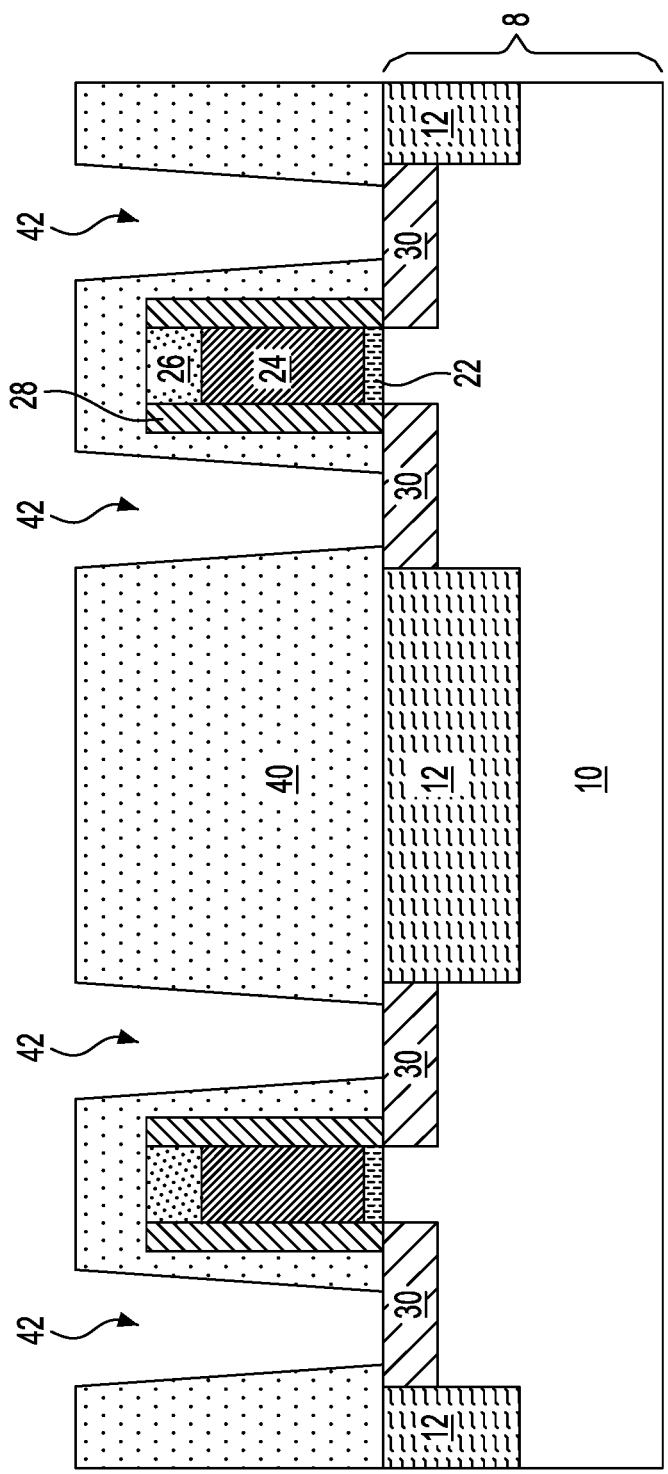
FIG. 3 is a cross-sectional view of the exemplary semiconductor structure of FIG. 2 after forming source/drain contact openings extending through the ILD layer.

Referring to FIG. 3, source/drain contact openings 42 are formed. Each source/drain contact opening 42 extends through the ILD layer 40 to expose a portion of one of the source/drain regions 30. The source/drain contact openings 42 can be formed by applying a mask layer (not shown) over the ILD layer 40, and then lithographically patterning the mask layer to form openings therein. Each opening overlies a portion of one of the source/drain regions 30. The mask layer can be a photoresist layer or a photoresist layer in conjunction with hardmask layer(s). The pattern in the mask layer is transferred through the ILD layer 40 to form the source/drain contact openings 42. In one embodiment of the present application, a reactive ion etch (RIE) may be performed to remove portions of the ILD layer 40 that are not covered by the remaining mask layer to expose portions of the source/drain regions 30 within the source/drain contact openings 42. The RIE chemistry is selected depending on the dielectric material of the ILD layer 40. After forming the source/drain contact openings 42, the remaining mask layer can be removed by oxygen-based plasma etching.

Figure 4:
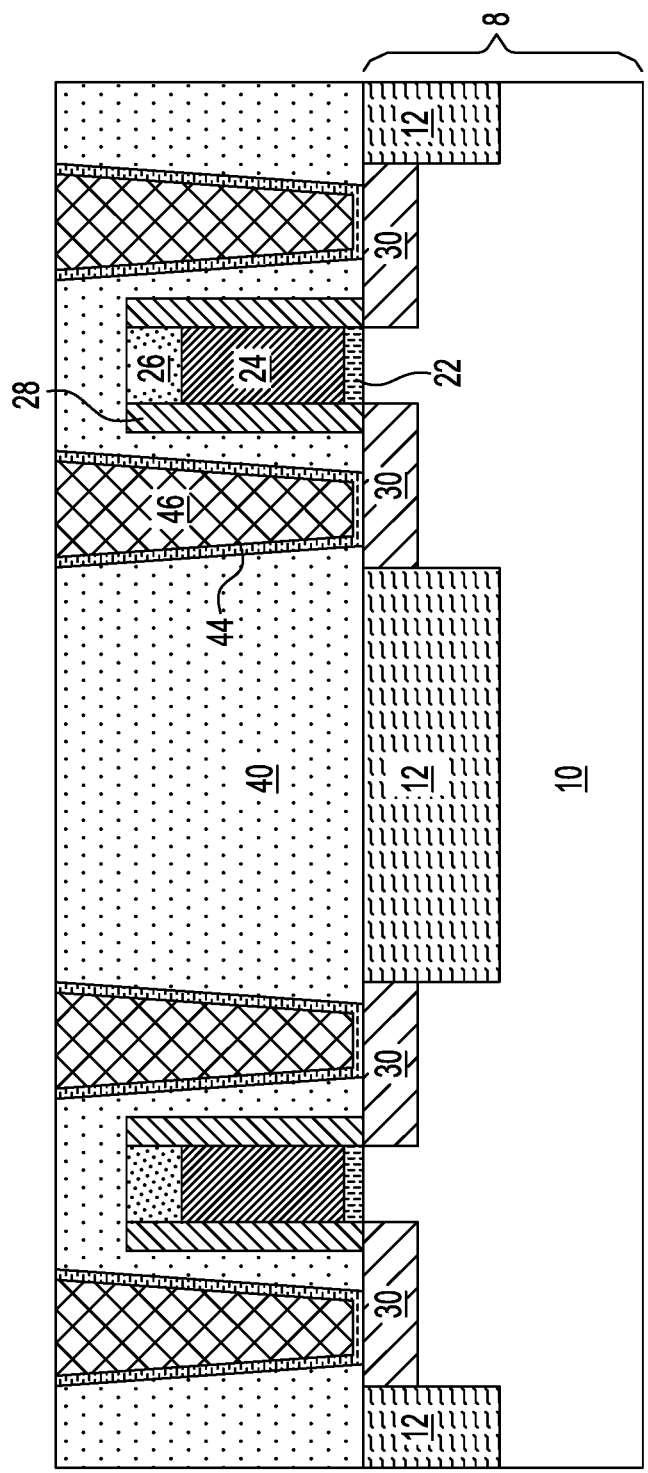
FIG. 4 is a cross-sectional view of the exemplary semiconductor structure of FIG. 3 after forming source/drain contact structures in the source/drain contact openings.

Referring to FIG. 4, source/drain contact structures are formed in the source/drain contact openings 42. Each of the source/drain contact structures includes a source/drain contact liner portion 44 present along sidewalls and a bottom surface of one of the source/drain contact openings 42 and a source/drain contact conductor portion 46 overlying the source/drain contact liner 44 and filling a remaining volume of the source/drain contact opening 42.

The source/drain contact structures (44, 46) can be formed by first depositing a contact liner layer (not shown) along the sidewalls and bottom surfaces of the source/drain contact openings 42 and the top surface of the ILD layer 40. The contact liner layer may include Ti, Ta, Ni, Co, Pt, W, TiN, TaN, WN, WC, an alloy thereof, or a stack thereof such as Ti/TiN and Ta/TaN. In one embodiment, the contact liner layer includes Ti/TiN. The contact liner layer may be formed utilizing a conformal deposition process including CVD or ALD. The contact liner layer that is formed can have a thickness ranging from 1 nm to 5 nm, although lesser and greater thicknesses can also be employed.

A contact conductive material layer (not shown) is subsequently deposited on the contact liner layer to completely fill the source/drain contact openings 42. The contact conductive material layer may include a metal such as, for example, W, Al, Cu, or their alloys. The contact conductive material layer can be formed by any suitable deposition method such as, for example, CVD, PVD or plating.

Portions of the contact liner layer and the contact conductive material layer that are located above the top surface of the ILD layer 40 are then removed by employing a planarization process, such as, for example, CMP. Remaining portions of the contact liner layer within the source/drain contact openings 42 constitute source/drain contact liner portions 44, while remaining portions of the contact conductive material layer within the source/drain contact openings 42 constitute source/drain contact conductor portions 46.

Figure 5:
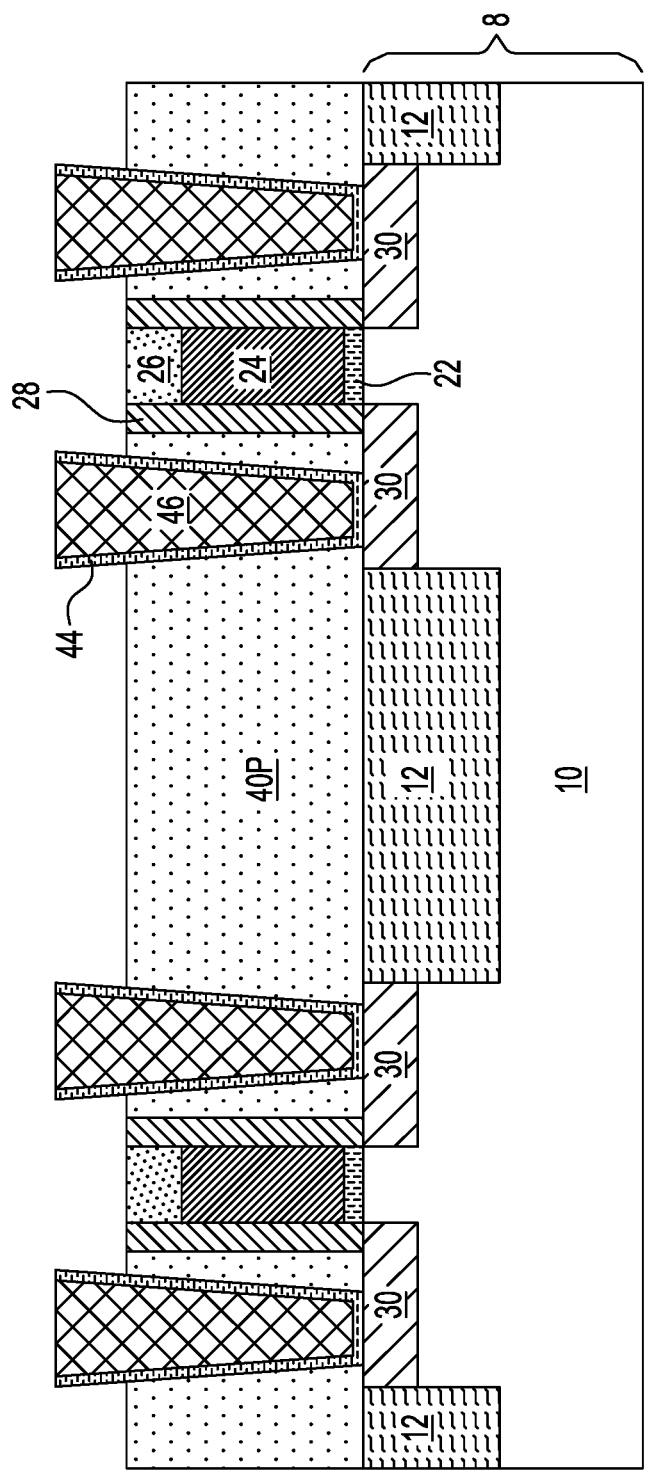
FIG. 5 is a cross-sectional view of the exemplary semiconductor structure of FIG. 4 after recessing the ILD layer to provide an ILD portion and to expose upper portions of the source/drain contact structures.

Referring to FIG. 5, the ILD layer 40 is recessed to expose an upper portion of each of the source/drain contact structures (44, 46). An etch back process can be performed to remove the dielectric material of the ILD layer 40 selective to the conductive materials of the source/drain contact liner portions 44 and the source/drain contact conductor portions 46 and in some embodiments, the dielectric materials of the gate caps 26 and gate spacers 28. The etch back process can be a dry etch such as, for example RIE or a wet etch employing diluted hydrofluoric acid (DHF). The remaining portion of the ILD layer 40 is herein referred to as an ILD portion 40P. In one embodiment and as shown in FIG. 5, the ILD layer 40 is recessed employing the top surfaces of the gate caps 26 as an etch stop, thus a top surface of the ILD portion 40P is coplanar with the top surfaces of the gate caps 26. In another embodiment, the ILD layer 40 can be recessed the a depth such that the top surface of the ILD portion 40P is located above the top surfaces of the gate caps 26 (not shown).

Figure 6:
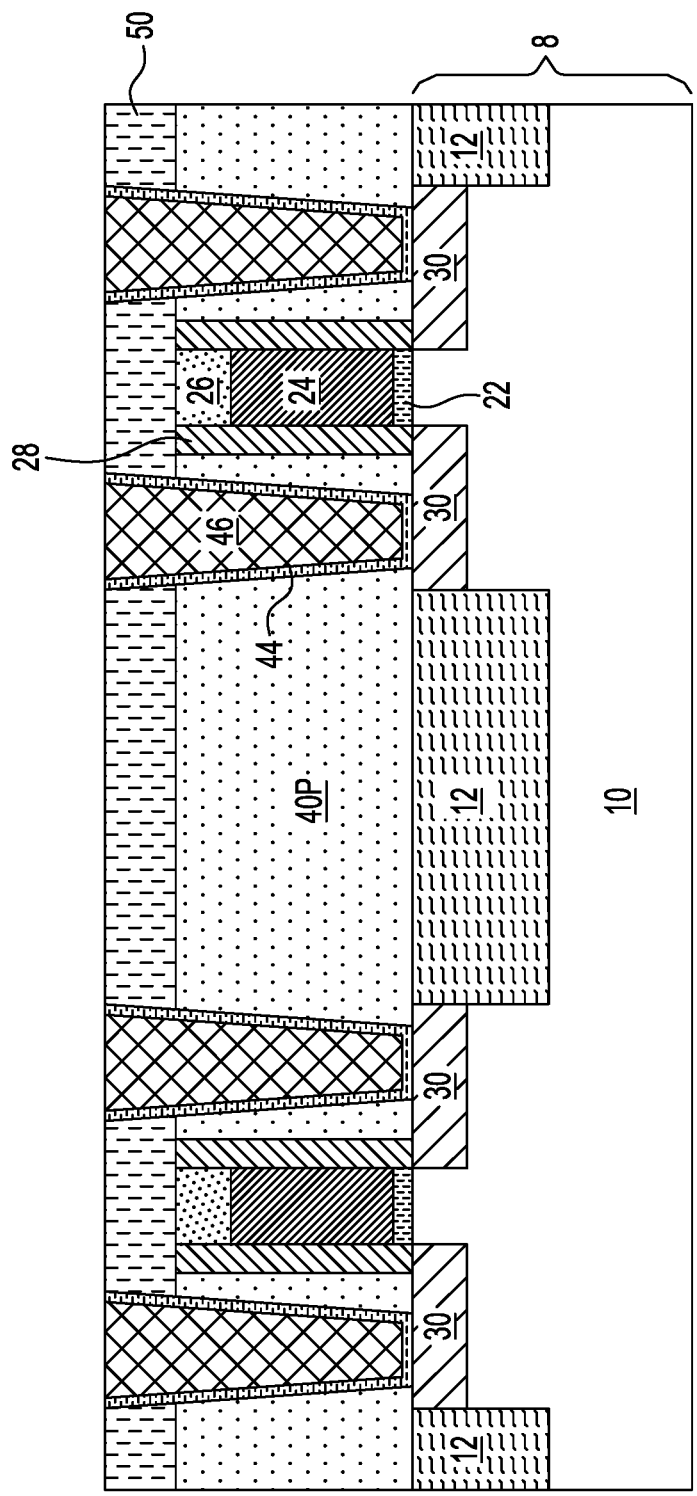
FIG. 6 is a cross-sectional view of the exemplary semiconductor structure of FIG. 5 after forming a sacrificial layer over the ILD portion and the gate structures to laterally surround the upper portions of the source/drain contact structures.

Referring to FIG. 6, a sacrificial layer 50 is deposited over the ILD portion 40P and the gate structures (22, 24, 26, 28) to laterally surround the upper portions of the source/drain contact structures (44, 46). The sacrificial layer 50 may include any material having an etch selectivity that permits selective etching relative to the ILD portion 40P, the source/drain contact liners 44, the gate caps 26 and the gate spacers 28. In one embodiment, the sacrificial layer 50 includes amorphous carbon. The sacrificial layer 50 can be formed by a conventional deposition process, for example, CVD, PVD or spin-oncoating.

Following the deposition of the sacrificial layer 50, the sacrificial layer 50 can be planarized, for example, by CMP using the topmost surfaces of the source/drain contact structures (44, 46) as an etch stop. After the planarization, a top surface of the sacrificial layer 50 is coplanar with the topmost surfaces of the source/drain contact structures (44, 46).

Figure 7:
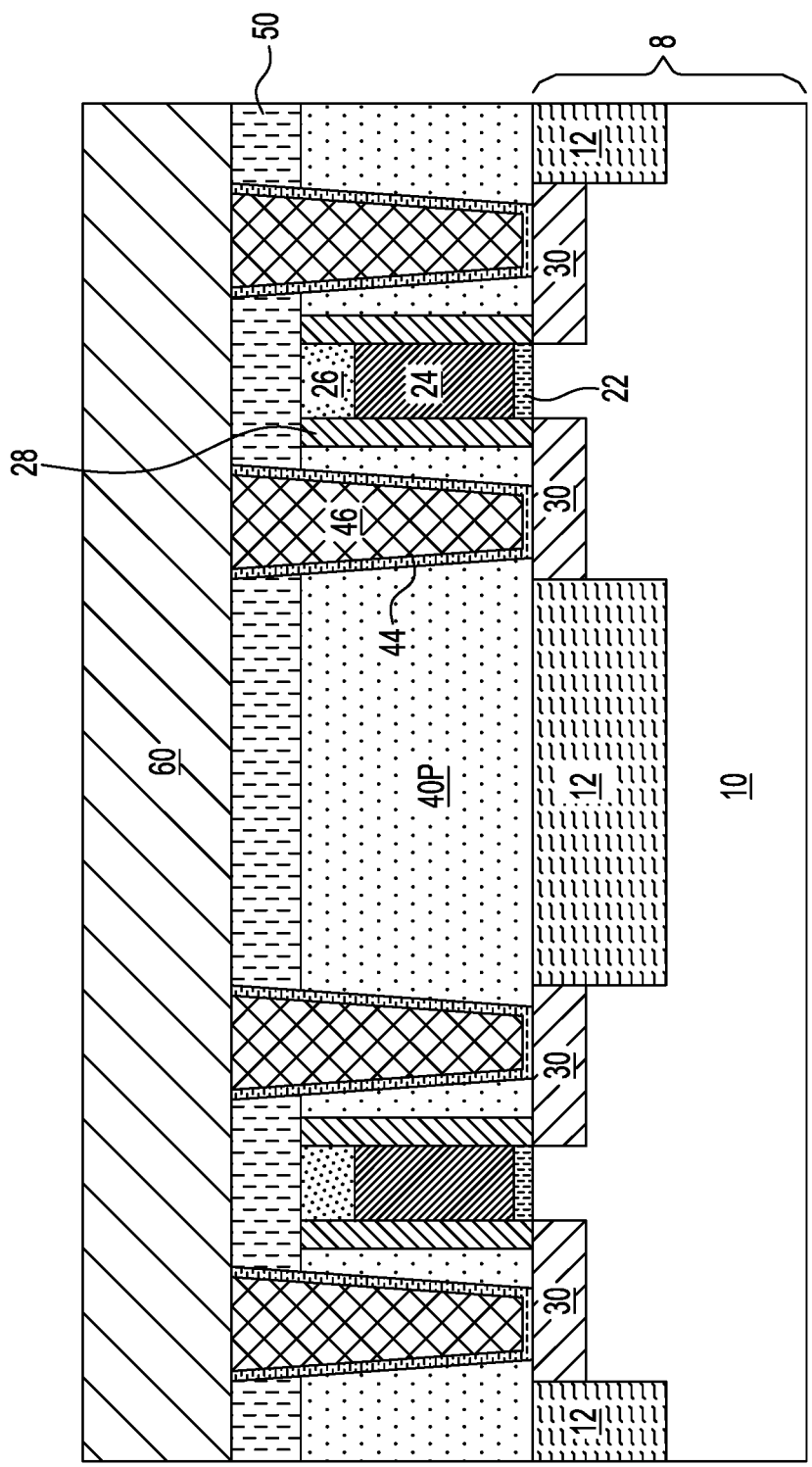
FIG. 7 is a cross-sectional view of the exemplary semiconductor structure of FIG. 6 after forming a metal layer over the sacrificial layer and the source/drain contact structures.

Referring to FIG. 7, a metal layer 60 is blanket deposited on the sacrificial layer 50 and the source/drain contact structures (44, 46). The metal layer 60 may include a Cu, W, Al, Ag, Au, a multilayered stack thereof, or an alloy thereof. In one embodiment, the metal layer 60 is composed of Cu.

In one embodiment of the present application, prior to the formation of the metal layer 60, a metal liner layer (not shown) can be optionally formed on the sacrificial layer 50 and the source/drain contact structures (44, 46). When employed, the metal liner layer may include TiN or TaN.

The metal layer 60 can be formed utilizing a conventional deposition process including, for example, CVD, PECVD, ALD, PVD or plating. The metal layer 60 that is formed can have a thickness ranging from 20 nm to 200 nm, although lesser and greater thicknesses can also be employed. The metal layer 60 may then be annealed at an elevated temperature, thereby maximizing the metal grain size.

Figure 8:
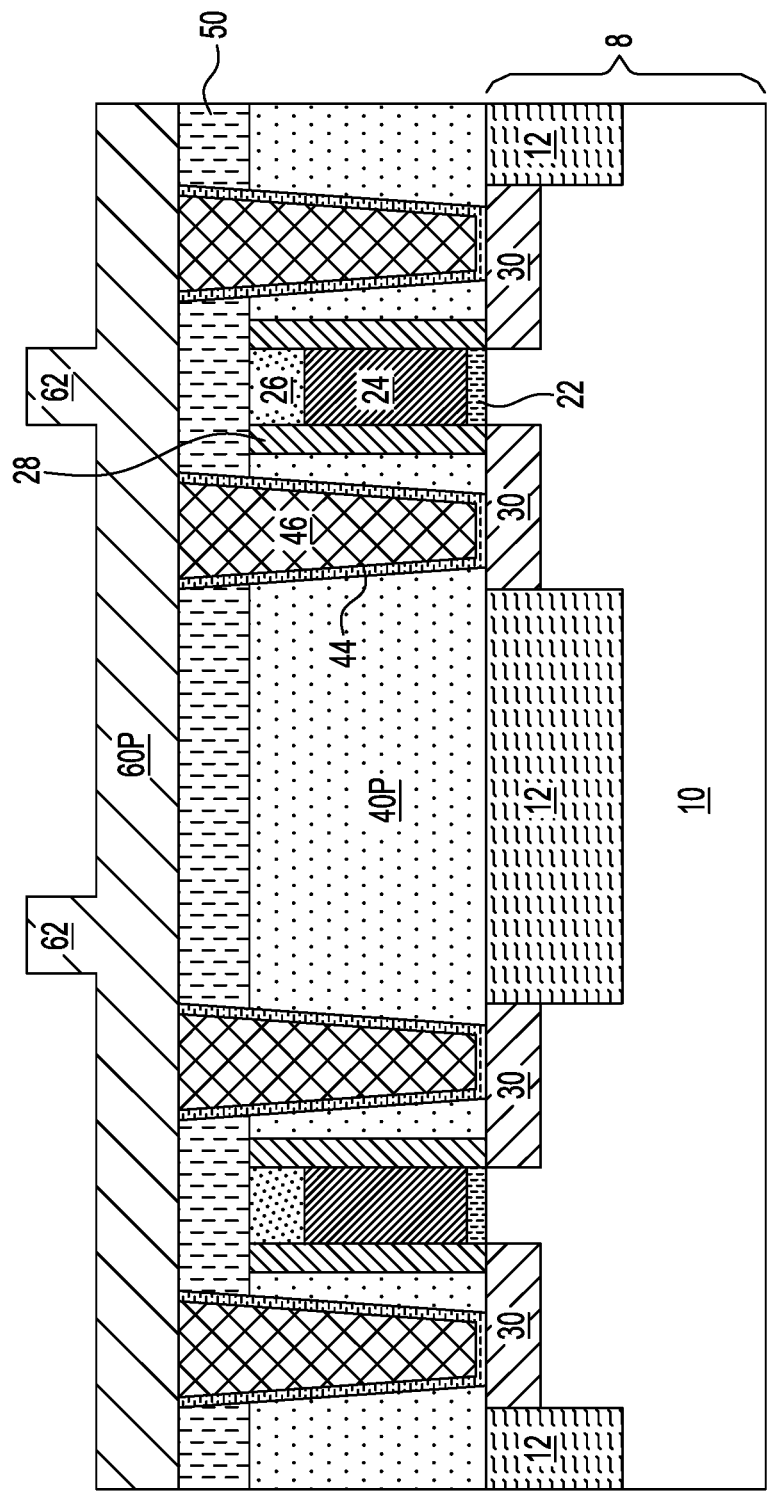
FIG. 8 is a cross-sectional view of the exemplary semiconductor structure of FIG. 7 after forming contact vias in an upper portion of the metal layer.

Referring to FIG. 8, contact vias 62 are formed in an upper portion of the metal layer 60. A mask layer (not shown) is first applied on the metal layer 60. The mask layer can be a photoresist layer or a photoresist layer in conjunction with hardmask layer(s). The mask layer is then lithographically patterned to provide a patterned mask layer that defines locations of contact vias 62 subsequently formed within the metal layer 60. The exposed portions of the metal layer 60 are then etched to a selected depth to provide the contact vias 62. In one embodiment, anisotropic etch such as, for example, RIE may be performed to etch the exposed portions of the metal layer 60. The remaining portion of the metal layer 60 that contains the contact vias 62 is herein referred to as a patterned metal layer 60P. After forming the contact vias 62, the patterned mask layer can be removed by oxygen-based plasma etching.

Figure 9:
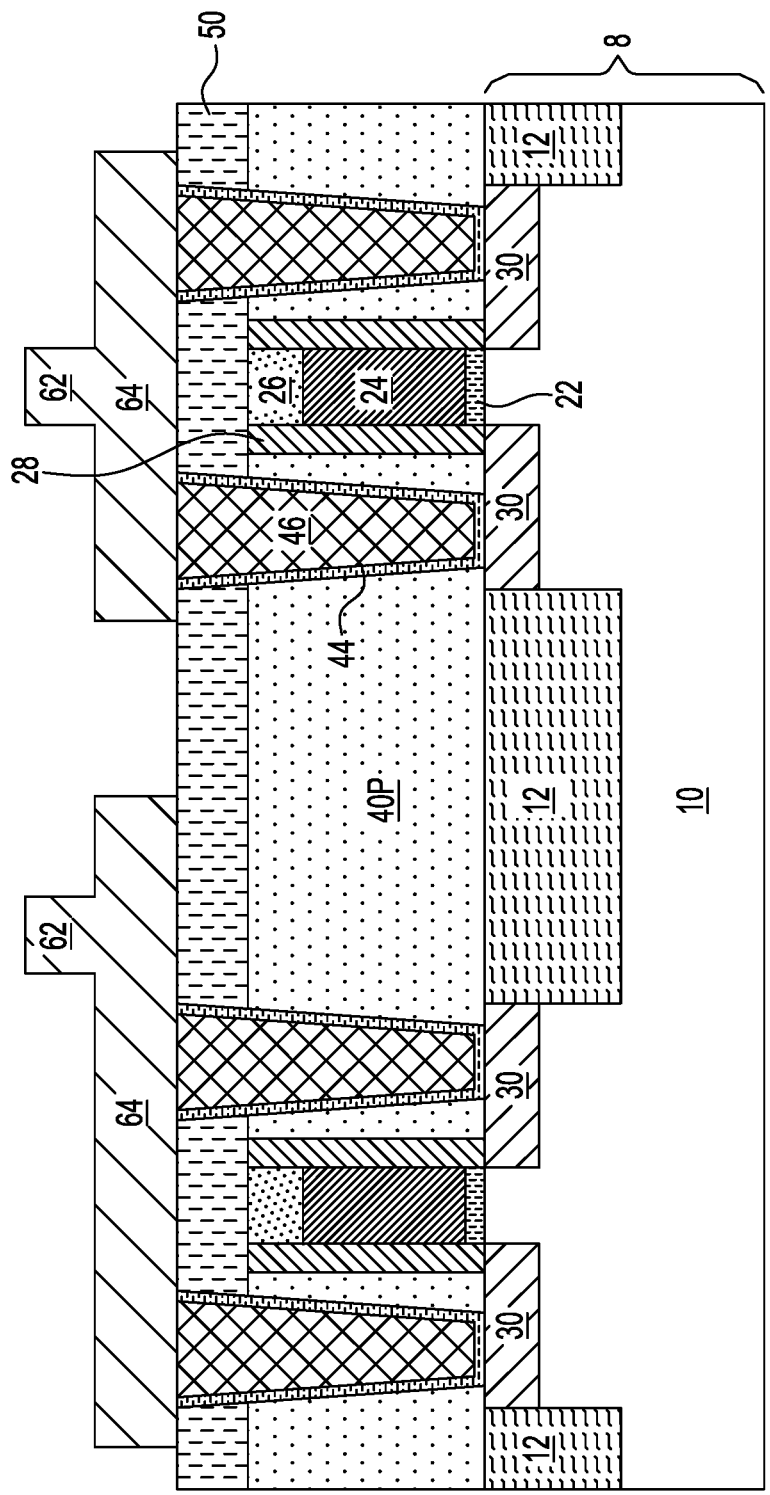
FIG. 9 is a cross-sectional view of the exemplary semiconductor structure of FIG. 8 after forming a contact line extending beneath each of the contact vias.

Referring to FIG. 9, a contact line 64 is formed extending beneath each of the contact vias 62. In one embodiment and as shown in FIG. 9, each contact line 64 is formed in contact with both source/drain contact structures (44, 46) present on opposite sides of one gate structure (22, 24, 26, 28). In another embodiment, each contact line 64 can be formed in contact with a single source/drain contact structure (44, 46) (not shown). Each contact line 64 and an overlying contact via 62 together constitute an interconnect conductor portion. The contact lines 64 can be formed by first applying a mask layer (not shown) over the patterned metal layer 60P and lithographically patterning the mask layer to provide a patterned mask layer that covers portions of the patterned metal layer 60P where contact lines 64 are to be formed. The exposed portions of the patterned metal layer 60P are removed by an anisotropic etch that removes the metal or metal alloy providing the metal layer 60 selective to the material providing the sacrificial layer 50. The anisotropic etch can be a dry etch such as RIE or a wet etch. After forming the contact lines 64, the patterned mask layer can be removed by oxygen-based plasma etching.

It should be understood that although FIGS. 8 and 9 illustrate that the contact vias 62 are formed prior to the formation of the contact lines 64, alternatively the contact lines 64 can be formed prior to the formation of the contact vias 62 by the subtractive etch described above.

In the present application, since contact vias 62 and contact lines 64 in the interconnect conductor portions (62, 64) are formed by blanket deposition of a metal layer 60 followed by subtractive patterning of the metal layer 60, the grain sizes of the deposited metal can be grown to a larger dimension in the blanket film deposition than in conformal fill deposition. Such larger grain size results in an increase in electrical conductivity due to reduced electron scattering at grain boundaries as electrons travel from one grain to the next during conduction.

Figure 10:
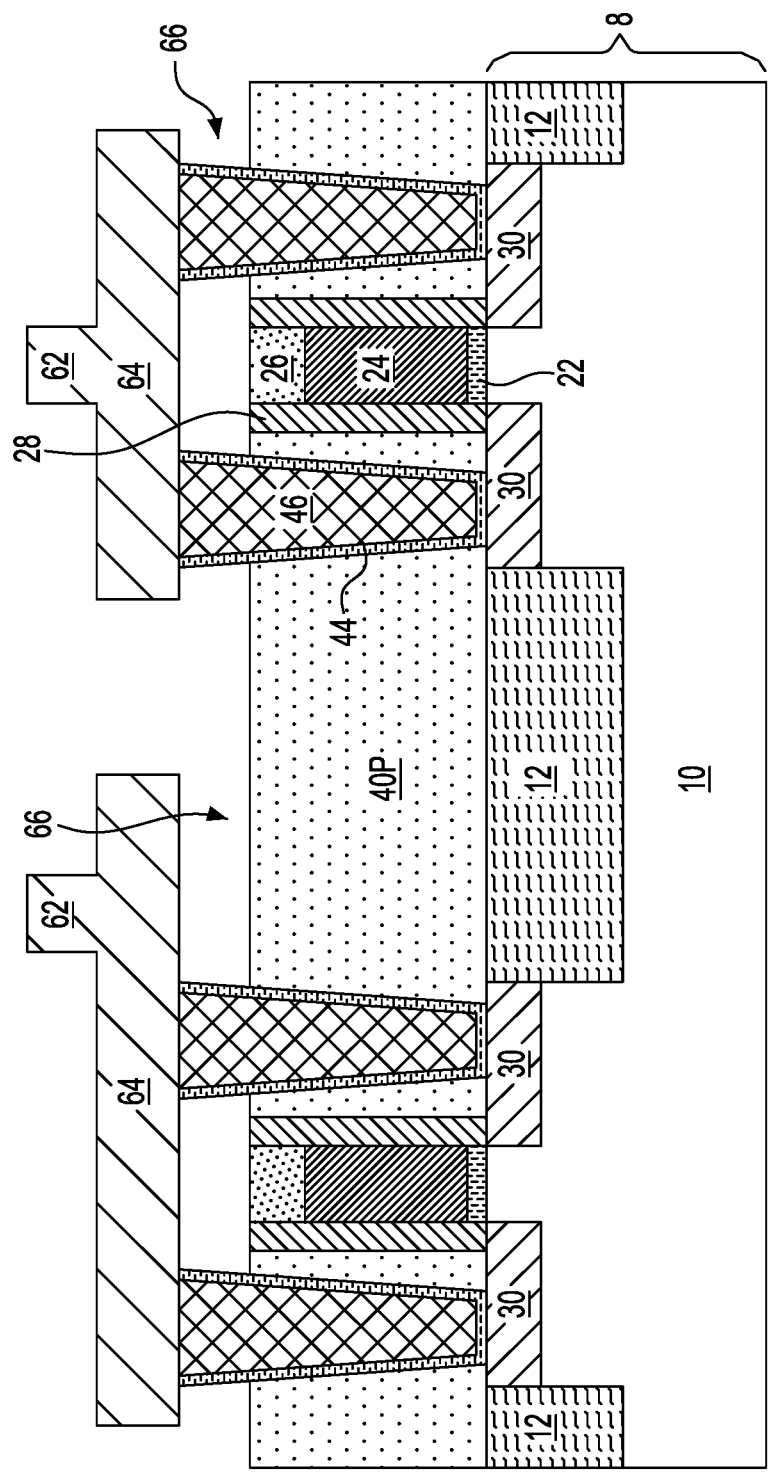
FIG. 10 is a cross-sectional view of the exemplary semiconductor structure of FIG. 9 after removing the sacrificial layer from the structure to provide a void between each of the interconnect conductor portions and the ILD portion

Referring to FIG. 10, the sacrificial layer 50 is removed from the structure to re-expose the upper portions of the source/drain contact structures (44, 46). The removal of the sacrificial layer 50 can be performed using a wet etch or a dry etch that etches the material of the sacrificial layer 50 selective to the dielectric materials of the ILD portion 40P, the gate caps 26 and gate spacers 28 and conductive materials of the source/drain contact liner portions 44 and the interconnect conductor portions (62, 64). In one embodiment and when the sacrificial layer 50 is composed amorphous carbon, the sacrificial layer 50 can be removed by an oxygen ashing process. The removal of the sacrificial layer 50 leaves a void 66 between each of the interconnect conductor portions (62, 64) and the ILD portion 40P.

Figure 11:
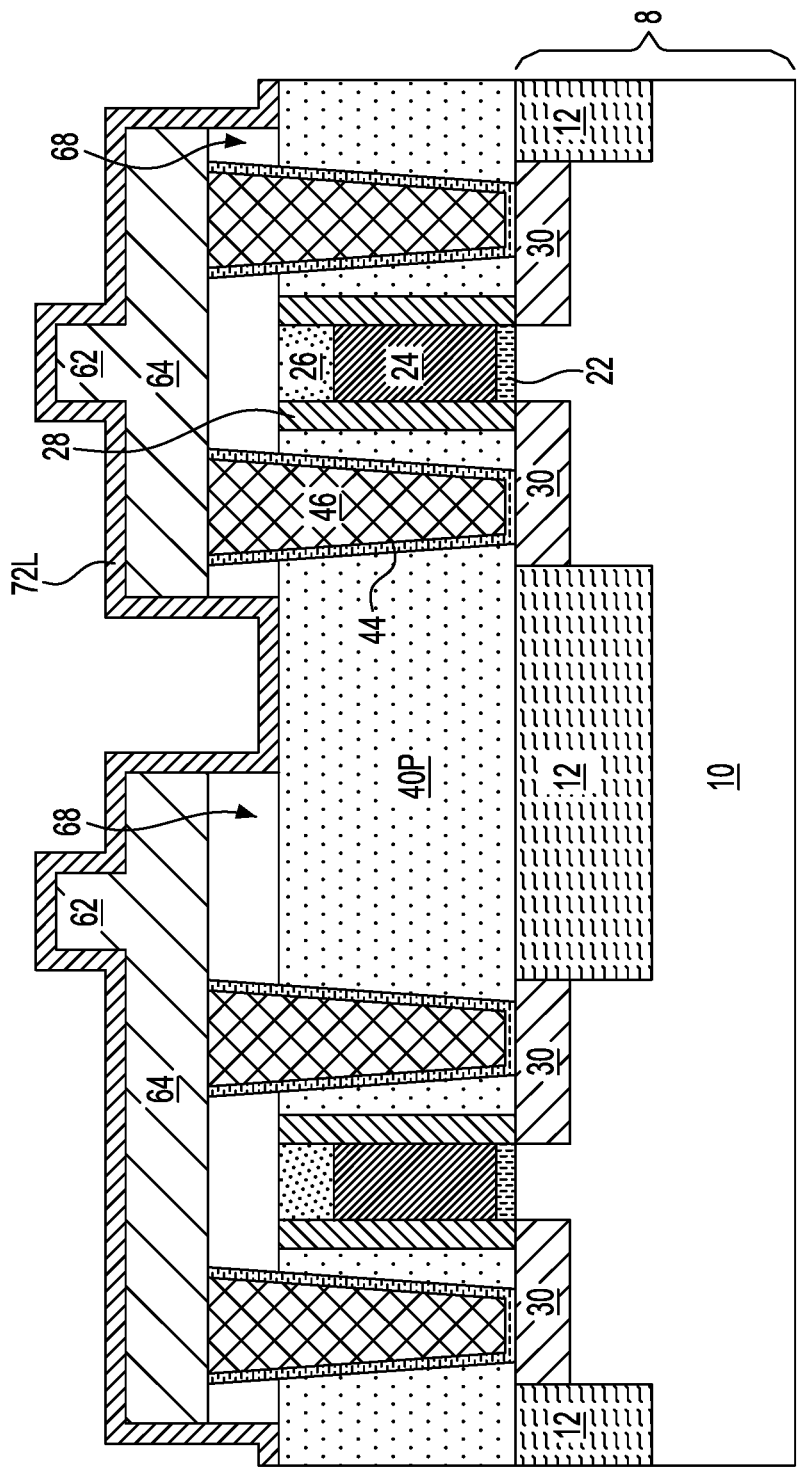
FIG. 11 is a cross-sectional view of the exemplary semiconductor structure of FIG. 10 after forming an interconnect liner layer on the exposed surfaces of the ILD portion, the contact vias and the contact lines and in each void to pinch off the void.

Referring to FIG. 11, an interconnect liner layer 72L is deposited on the exposed surfaces of the ILD portion 40P, the contact vias 62 and the contact lines 64 and in the voids 66. The deposition process may be controlled such that the interconnect liner layer 72L pinches off the voids 66, providing an air gap 68 between each of the interconnect conductor portions (62, 64) and the ILD portion 40P. Each air gap 68 surrounds the upper portions of adjacent source/ drain contact structures (44, 46), thus reducing the parasitic capacitance between the adjacent source/drain contact structures (44, 46).

The interconnect liner layer 72L is typically composed of a non-conductive material that serves as a diffusion barrier between the interconnect conductor portions (62, 64) and a contact level dielectric layer 74 subsequently formed. For example, the interconnect liner layer 72L may include silicon nitride, silicon oxide, hafnium oxide or other metal oxides. In one embodiment, the interconnect liner layer 72L includes silicon nitride.

To preserve the air gaps 68 for the desired capacitance reduction between the adjacent source/drain contact structures (44, 46), a deposition mode featuring highly non-conformal deposition characteristics is chosen for formation of the interconnect liner layer 72L. The interconnect liner layer 72L may be formed, for example, by PECVD. The interconnect liner layer 72L that is formed may have a thickness from 1 nm to 10 nm, although lesser and greater thicknesses can also be employed.

Figure 12:
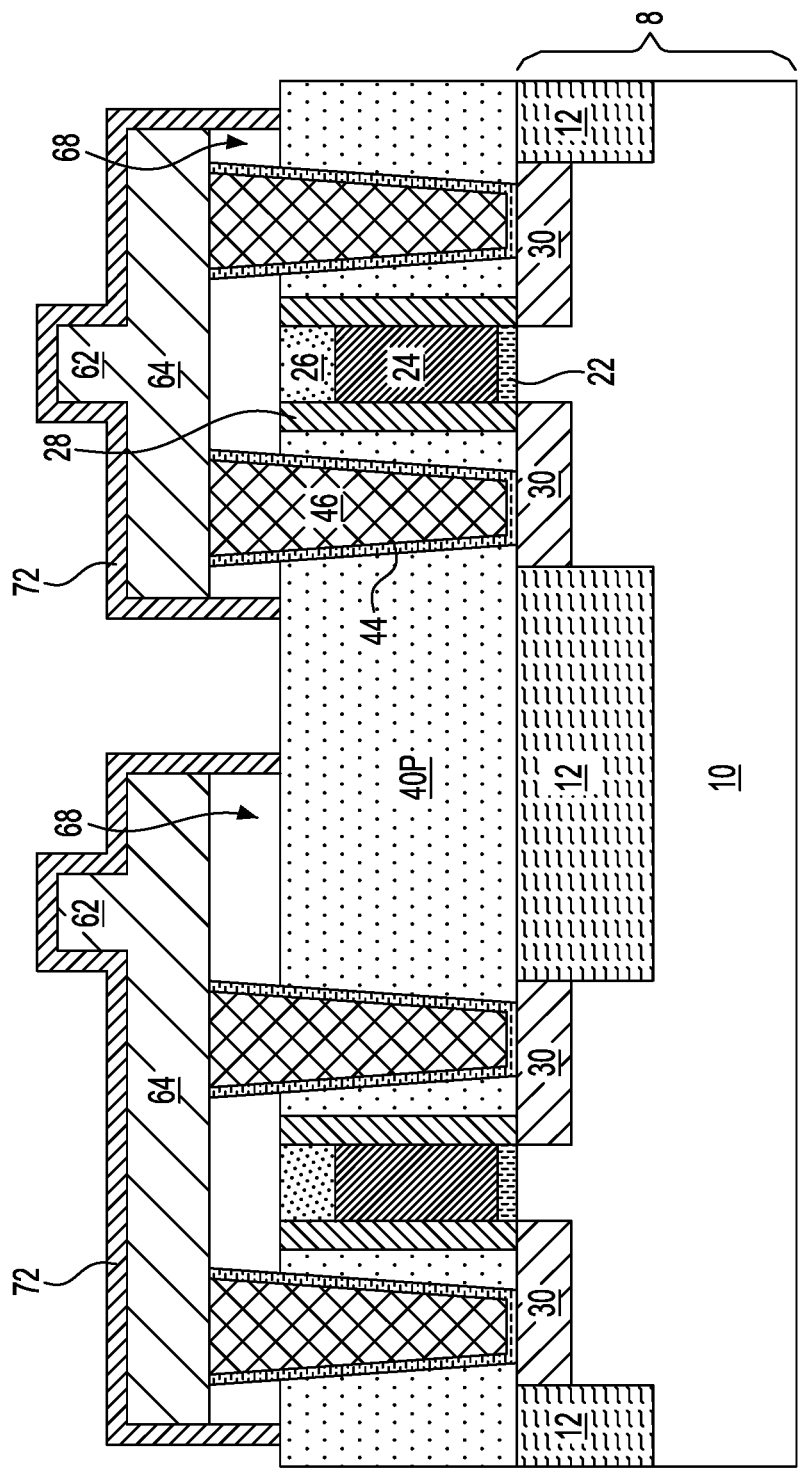
FIG. 12 is a cross-sectional view of the exemplary semiconductor structure of FIG. 11 after forming interconnect liner portions.

Referring to FIG. 12, portions of the interconnect liner layer 72L that are present on the top surface of the ILD portion 40P are removed by an etch that removes the material of the interconnect liner layer 72L selective to the dielectric material of the ILD portion 40P. The etch can be a directional etch such as, for example, RIE. A remaining portion of the interconnect liner layer 72L that has a first portion present on the top surfaces and sidewalls of each interconnect conductor portion (62, 64) and a second portion enclosing an air gap 68 located between each interconnect conductor portion (62, 64) and the ILD portion 40P is herein referred to as an interconnect liner portion 72. This etching step is optional and can be omitted in some embodiments of the present application.

An interconnect structure is thus formed to provide electrical connection to at least one the source/drain contact structure (44, 46). Each interconnect structure includes an interconnect conductor portion containing a contact via 62 and a contact line 64 extending beneath the contact via 62 and an interconnect liner portion 72 having a first portion present on the top surfaces and sidewalls of the interconnect conductor portion (62, 64) and a second portion enclosing an air gap 68 located between the interconnect conductor portion (62, 64) and the ILD portion 40P.The air gap 68 surrounds an upper portion of the at least one source/drain contact structure (44, 46).

Figure 13:
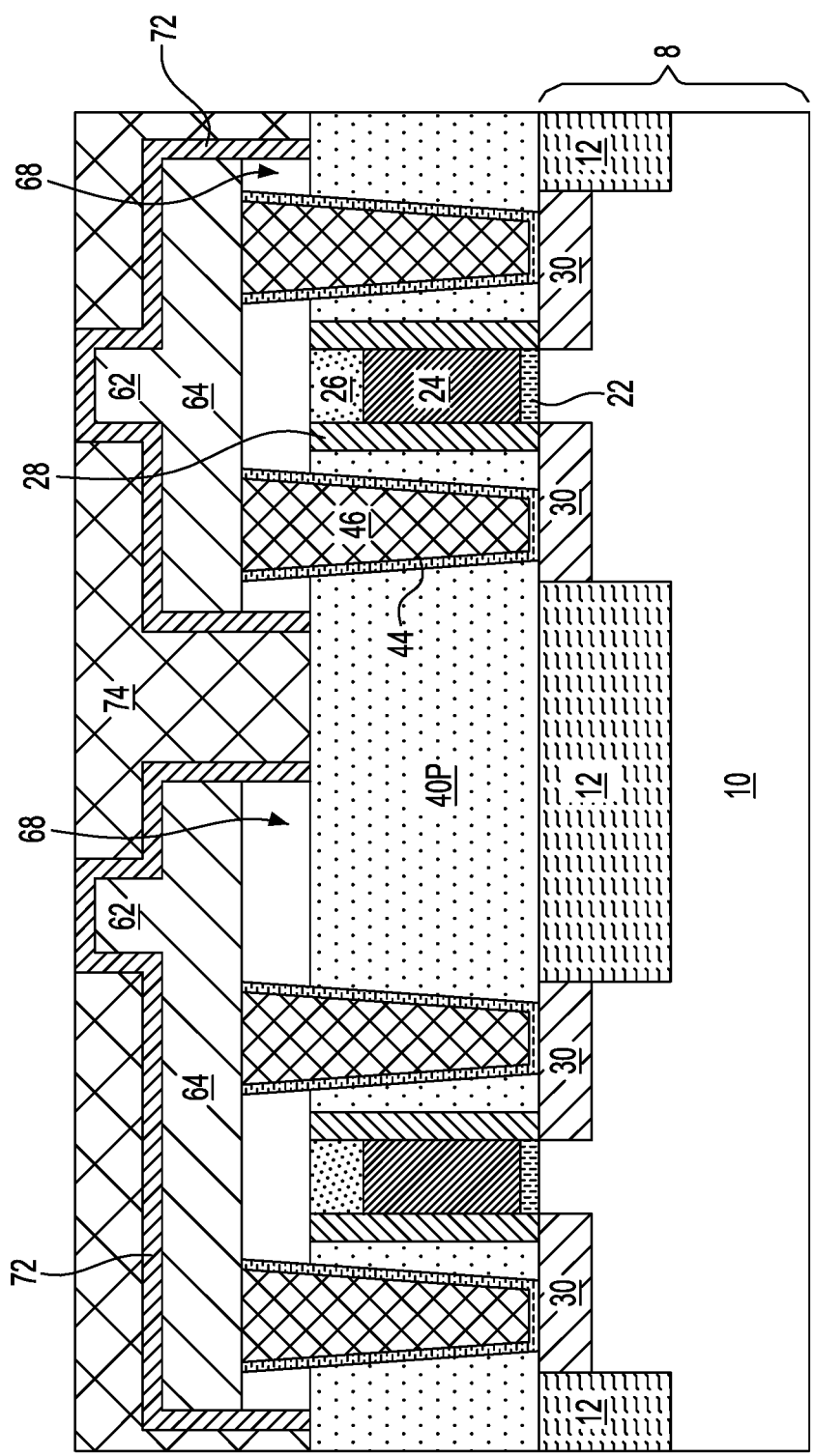
FIG. 13 is a cross-sectional view of the exemplary semiconductor structure of FIG. 12 after forming a contact level dielectric layer over the interconnect liner portions and the ILD portion.

Referring to FIG. 13, a contact level dielectric layer 74 is formed over the interconnect liner portions 72 and the ILD portion 40P. The contact level dielectric layer 74 may include a dielectric material the same as, or different from, the dielectric material that provides the ILD layer 40. For example, the contact level dielectric layer 74 may include a dielectric material such as undoped silicon oxide, doped silicon oxide, porous or non-porous organosilicate glass, porous or non-porous nitrogen-doped organosilicate glass, or a combination thereof. The contact level dielectric layer 74 can be formed by CVD, PVD or spin-on coating. The contact level dielectric layer 74 can be subsequently planarized for example, by CMP and/or a recess using the topmost surfaces of the interconnect liner portions 72 as an etch stop. The contact level dielectric layer 74 thus formed laterally surrounds the interconnect structures (62, 64, 72) and has a top surface coplanar with the topmost surfaces of the interconnect liner portions 72.

Figure 14:
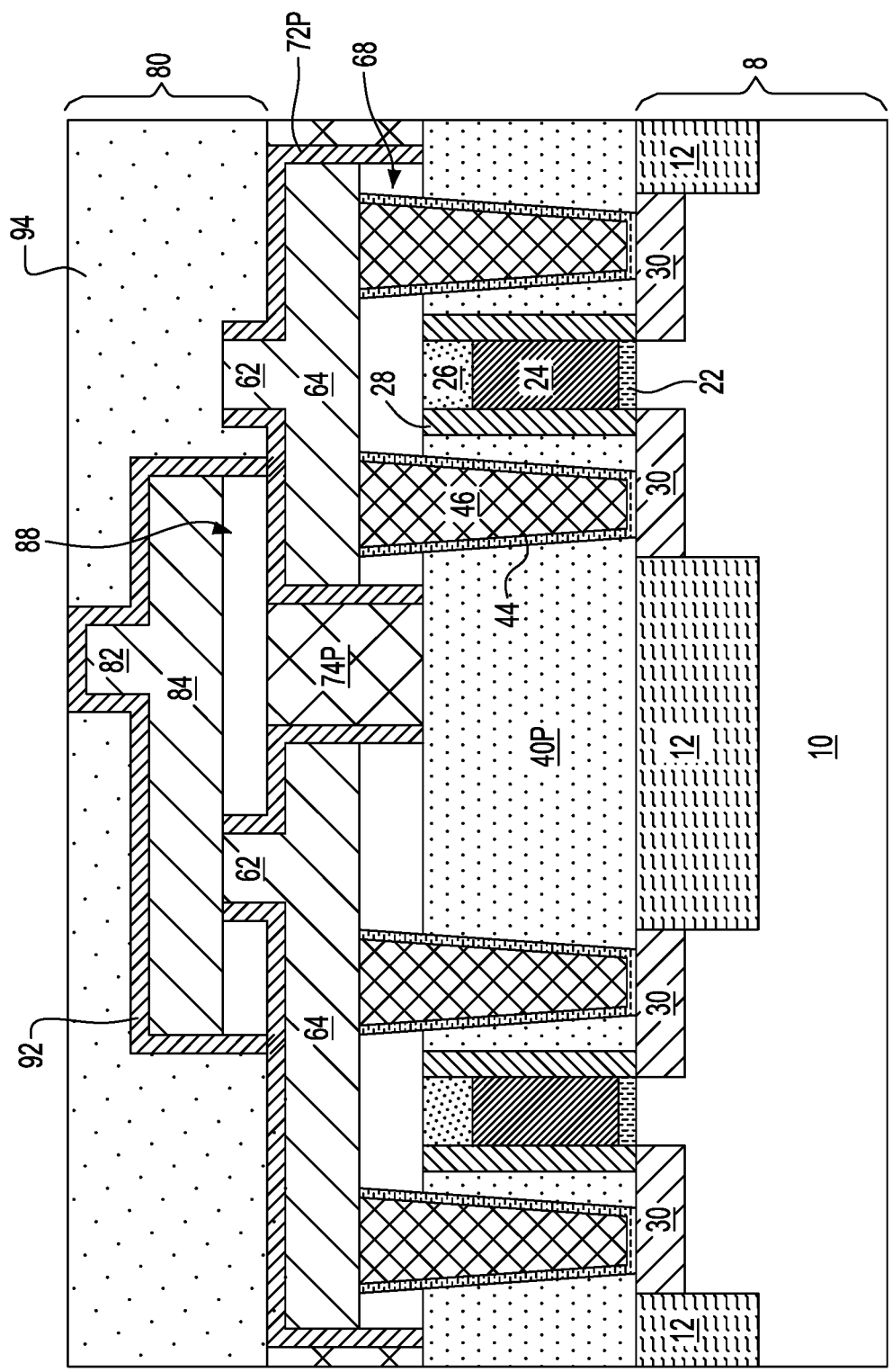
FIG. 14 is a cross-sectional view of the exemplary semiconductor structure of FIG. 13 after forming an upper level metallization layer.

Referring to FIG. 14, the processing steps described in FIGS. 5 through 13 may be employed to provide upper level metallization layers. In one embodiment and as shown in FIG. 14, an upper level metallization layer 80 including an upper level interconnect structure is formed to provide electrical connection to one of the interconnect structures (62, 64, 72). The upper level interconnect structure includes an upper level interconnect conductor portion containing an upper level contact via 82 and an upper level contact line 84 extending beneath the upper level contact via 82 and an upper level interconnect liner portion 92 having a first portion present on the top surfaces and sidewalls of the upper level interconnect conductor portion (82, 84) and a second portion enclosing an air gap 88 located between the upper level interconnect conductor portion (82, 84) and the interconnect structures (62, 64, 72). The air gap 88 surrounds contact via 62 of one of the interconnect structures (62, 64, 72).

The upper level metallization layer 80 can be formed by first recessing the contact level dielectric layer 74 by performing the processing steps described in FIG. 5 so as to provide a contact level dielectric portion 74P. The recessing of the contact level dielectric layer 74 exposes the contact vias 62 of the interconnect structures (62, 64, 72). A second sacrificial layer (not shown) is then formed on the contact level dielectric portion 74P to laterally surround the contact vias 62 by performing processing steps described in FIG. 6. Next, a portion of each interconnect liner portion 72 that is present on the top surfaces of the contact vias 62 is removed by a planarization process such as, for example, CMP to expose the top surfaces of the contact vias 62. Each remaining portion of the interconnect liner portion 72 in the interconnect structures (62, 74, 74) is herein referred to as a planarized interconnect liner portion 72P. Next, a second metal layer (not shown) is formed on the sacrificial layer and the contact vias 62 by performing processing steps of FIG. 7 and subsequently patterned by performing the processing steps described in FIGS. 8 and 9 to provide an upper level interconnect conductor portion that provides the electrical connection to one of the interconnect structure (62, 64, 72). The upper level interconnect conductor portion contains an upper level contact via 82 and an upper level contact line 84 extending beneath the upper level contact via 82. The sacrificial layer is removed by performing the processing steps of FIG. 10 to provide a void (not shown) surrounding the contact vias 62. Next, by sequentially performing the processing steps of FIGS. 11 and 12, an upper level interconnect liner portion 92 is formed along the top surfaces and sidewalls of the upper level interconnect conductor portion (82, 84). The upper level interconnect liner portion 92 also pinches off the void to provide an air gap surrounding at least one of the contact vias 62. An upper contact level dielectric layer 94 is subsequently formed to surround the upper level interconnect structure (82, 84, 92).

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A method of forming a semiconductor structure comprising:
   forming source/drain regions on opposite sides of a gate structure located over a channel region of a semiconductor material layer;

forming source/drain contact structures in an interlevel dielectric (ILD) layer overlying the semiconductor material layer, each of the source/drain contact structures contacting one of the source/drain regions;

recessing the ILD layer to expose an upper portion of each of the source/drain contact structures;

forming a sacrificial layer over a remaining portion of the ILD layer to laterally surround the upper portion of each of the source/drain contact structures;

forming an interconnect conductor portion over the sacrificial layer to contact at least one of the source/drain contact structures;

removing the sacrificial layer to re-expose the upper portion of each of the source/drain contact structures; and forming an interconnect liner portion, the interconnect liner portion having a first portion present on top and sidewall surfaces of the interconnect conductor portion and a second portion enclosing an air gap located between the interconnect conductor portion and the remaining portion of the ILD layer.

2. The method of claim 1, wherein the interconnect conductor portion comprising a contact via and a contact line extending beneath the contact via, the contact line directly contacting the at least one of the source/drain contact structures.

3. The method of claim 2, wherein the forming the interconnect conductor portion comprises:

forming a metal layer over the sacrificial layer and the source/drain contact structures;

patterning the metal layer to form the contact via in an upper portion of the metal layer; and patterning a remaining portion of the metal layer to form the contact line extending beneath the contact via, wherein the contact line vertically contacts the at least one of the source/drain contact structures.

4. The method of claim 3, further comprising annealing the metal layer prior to the patterning the metal layer.

5. The method of claim 3, wherein the metal layer comprises Cu, W, Al, Ag, Au, a multilayered stack thereof or an alloy thereof.

6. The method of claim 2, further comprising forming a contact level dielectric layer over the interconnect liner portion and the remaining portion of the ILD layer, the contact level dielectric layer laterally surrounding the interconnect conductor portion and having a top surface coplanar with a topmost surface of the interconnect liner portion.

7. The method of claim 1, wherein the forming the interconnect liner portion comprises:

forming an interconnect liner layer over a top surface of the remaining portion of the ILD layer and the top and sidewall surfaces of the interconnect conductor portion, wherein the interconnect liner layer pinches off a void formed by the removal of the sacrificial layer to provide the air gap; and removing portions of the interconnect liner layer from the top surface of the remaining portion of the ILD layer to provide the interconnect liner portion.

8. The method of claim 7, wherein the interconnect liner layer is formed by a non-conformal deposition process.

9. The method of claim 7, wherein the interconnect liner layer comprise silicon nitride, silicon oxide or hafnium oxide.

10. The method of claim 1, wherein the sacrificial layer comprises amorphous carbon.

11. The method of claim 10, wherein the removing the sacrificial layer is performed by oxygen ashing.

12. The method of claim 1, wherein the remaining portion of the ILD layer after the recessing the ILD layer has a top surface coplanar with a topmost surface of the gate structure.

13. The method of claim 1, wherein the remaining portion of the ILD layer after the recessing the ILD layer has a top surface located above a topmost surface of the gate structure.

14. The method of claim 1, wherein the forming the source/drain contact structures comprises:

forming source/drain contact openings extending through the ILD layer, each of the source/drain contact openings exposing at least a portion of one of the source/drain regions;

forming a contact liner layer over sidewalls and bottom surfaces of the source/drain contact openings and a top surface of the ILD layer;

forming a contact conductive material layer over the contact liner layer to completely fill the source/drain contact openings; and removing portions of the contact conductive material layer and the contact liner layer from the top surface of the ILD layer.

15. The method of claim 14, wherein the contact liner layer comprises Ti, Ta, Ni, Co, Pt, W, TiN, TaN, WN, WC, Ti/TiN or Ta/TaN.

16. The method of claim 14, wherein the contact conductive material layer comprises W, Al or Cu.

17. The method of claim 1, wherein the gate structure comprises a gate stack comprising a gate dielectric, a gate electrode and a gate cap, and a gate spacer located on sidewalls of the gate stack.

18. The method of claim 17, further comprising forming the gate stack, wherein the forming the gate stack comprises:

forming a material stack comprising, from bottom to top, a gate dielectric layer, a gate electrode layer and a gate cap layer over the semiconductor material; and patterning the material stack to provide the gate stack contacting the channel region of a semiconductor material layer.

19. The method of claim 18, further comprising forming the gate spacer, wherein the forming the gate spacer comprises:

forming a conformal gate spacer material layer on exposed surfaces of the gate stack and the semiconductor material layer; and removing horizontal portions of the gate spacer material layer.

20. The method of claim 1, wherein the forming the source/drain regions is performed by ion implantation.

* * * * *